United States Patent [19]
Durec

[11] Patent Number: 6,144,845
[45] Date of Patent: Nov. 7, 2000

[54] METHOD AND CIRCUIT FOR IMAGE REJECTION

[75] Inventor: Jeffrey C. Durec, Chandler, Ariz.

[73] Assignee: Motorola, Inc., Schaumburg, Ill.

[21] Appl. No.: 09/002,305

[22] Filed: Dec. 31, 1997

[51] Int. Cl.[7] .............................. H04B 1/10; H04B 1/26
[52] U.S. Cl. ......................... 455/285; 455/302; 455/314
[58] Field of Search .................................. 455/285, 302, 455/317, 304, 305, 314, 323, 333, 324, 326

[56] References Cited

U.S. PATENT DOCUMENTS

| | | | |
|---|---|---|---|
| 3,753,142 | 8/1973 | Nardin et al. | 331/1 |
| 4,580,289 | 4/1986 | Enderby | 455/314 |
| 4,696,055 | 9/1987 | Marshall | 455/118 |
| 4,718,113 | 1/1988 | Rother et al. | 455/209 |
| 5,014,352 | 5/1991 | Chung | 455/314 |
| 5,222,253 | 6/1993 | Heck | 455/78 |
| 5,263,194 | 11/1993 | Ragan | 455/316 |
| 5,263,195 | 11/1993 | Panther et al. | 455/316 |
| 5,303,417 | 4/1994 | Laws | 455/314 |
| 5,355,533 | 10/1994 | Dickerson | 455/306 |
| 5,410,743 | 4/1995 | Seely et al. | 455/326 |
| 5,584,066 | 12/1996 | Okanobu | 455/302 |
| 5,606,736 | 2/1997 | Hassler et al. | 455/314 |
| 5,668,505 | 9/1997 | Vu et al. | 331/49 |
| 5,761,615 | 6/1998 | Jaffee | 455/314 |

FOREIGN PATENT DOCUMENTS

| | | | |
|---|---|---|---|
| 0 782249 | 7/1997 | European Pat. Off. | H03D 7/18 |
| 2236225 | 3/1991 | United Kingdom | H03D 7/18 |

OTHER PUBLICATIONS

"Introduction to Communication Systems", Third Edition, by Ferrel G. Stremler, Copyright 1990, Example 5.3.1, pp. 254–255.

*Primary Examiner*—Reinhard J. Eisenzopf
*Assistant Examiner*—Charles N. Appiah
*Attorney, Agent, or Firm*—Lanny L. Parker; Anthony M. Martinez

[57] ABSTRACT

An image rejection circuit (10) receives an incoming signal ($RF_{IN}$) and an oscillator signal ($V_{OSC}$) generated by a local oscillator (26). Output signals ($I_{OUT20}$ and $I_{OUT40}$) are generated by first mixer circuits (14 and 34) by multiplying the incoming signal ($RF_{IN}$) with the oscillator signal ($V_{OSC}$). Second mixer circuits (24 and 44) multiply the output signals ($I_{OUT20}$ and $I_{OUT40}$) with a counter signal that is a divided oscillator signal ($V_{OSC}$). A summing circuit (46) sums the signals generated by the second mixer circuits (24 and 44) and provides a signal ($IF_{OUT}$). Phase shift circuits (22, 29, 31, and 42) provide a shifted oscillator signal ($V_{OSC}$) and a shifted counter signal to the first and second mixer circuits (14, 24, 34, and 44) that cause cancellation of unwanted image signals in the signal ($IF_{OUT}$).

7 Claims, 3 Drawing Sheets

METHOD AND CIRCUIT FOR IMAGE REJECTION

BACKGROUND OF THE INVENTION

The present invention relates, in general, to integrated circuits and, more particularly, to integrated circuits having mixer circuits for providing image rejection.

In electronic systems such as cellular or wireless telephones, a phase and frequency relationship exists between an incoming reference signal and a signal generated by a Local Oscillator (LO). Typically, mixers in a heterodyne receiver translate a Radio Frequency (RF) signal to a lower Intermediate Frequency (IF) signal. The mixers multiply the received RF signal with a Local Oscillator (LO) signal to generate the sum and difference frequencies between the RF and LO signals. A filter circuit is used to select the difference frequency, i.e., a mixed down signal, for recovering the modulation information that is contained in the translated RF signal.

Unwanted images having frequencies either higher or lower than the LO signal may also be present at the input of the receiver. The unwanted images are also translated in frequency by the mixers. It is desired that the signals at the outputs of the mixers be in-phase while the unwanted images be one hundred and eighty degrees out-of-phase and equal in amplitude. By summing the signals at the outputs of the mixers, the unwanted images being out-of-phase and equal in amplitude would completely cancel, while the desired signals would add to each other.

However, it is difficult to maintain equivalent signal attenuation through the mixers and linearity in phase shifters capable of generating a phase relationship of one hundred and eighty degrees between the unwanted images. Voltage and temperature changes in a heterodyne receiver cause signal distortions in phase shifters operating over a wide frequency range.

Accordingly, it would be advantageous to have a method and a circuit for frequency translating an incoming reference signal that cause unwanted images to be rejected.

DETAILED DESCRIPTION OF THE DRAWINGS

Generally, the present invention provides frequency translation of an incoming reference signal and rejection of undesired signals using a local oscillator, a divide-by-N counter, and a plurality of mixer circuits. The configuration of the image rejection circuit allows multiple mixer circuits to be arranged for reducing the number of components.

Figure 1:
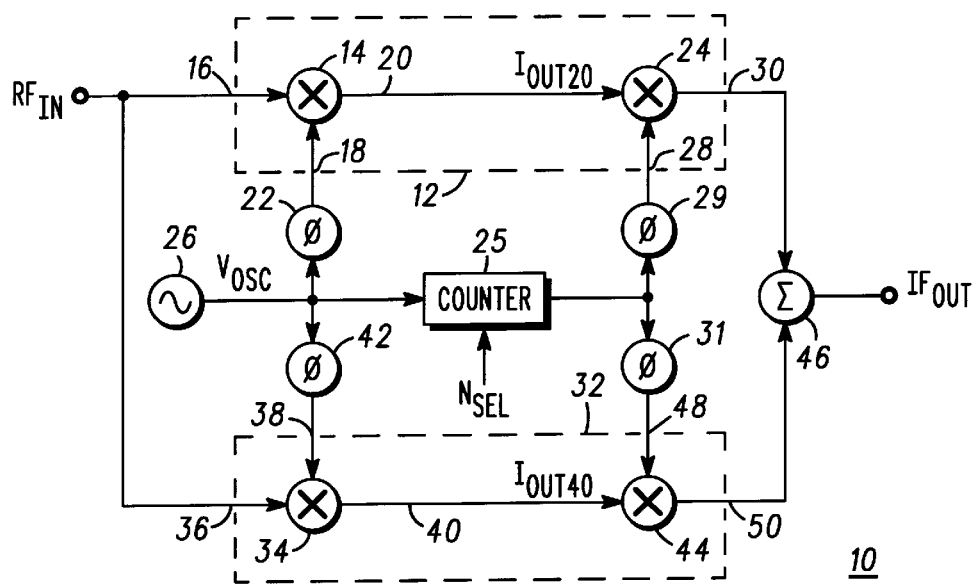
FIG. 1 is a block diagram of an image rejection circuit having a combined mixer circuit in accordance with the present invention.

FIG. 1 is a block diagram of an image rejection circuit 10 in accordance with the present invention. Image rejection circuit 10 is also referred to as a frequency translator circuit, an up converter circuit, or a down converter circuit. Image rejection circuit 10 includes combined mixer circuits 12 and 32 that receive a reference signal $RF_{IN}$ and generate output signals that are summed together to provide the translated signal $IF_{OUT}$. Thus, image rejection circuit 10 translates the signal $RF_{IN}$ whose carrier frequency is in the Radio Frequency (RF) range to the signal $IF_{OUT}$ whose carrier frequency is in the Intermediate Frequency (IF) range.

Combined mixer circuit 12 has input terminals 16, 18, and 28, and an output terminal 30. More particularly, combined mixer circuit 12 includes a mixer circuit 14 having a first input connected to terminal 16 for receiving the signal $RF_{IN}$. A second input of mixer circuit 14 is connected to terminal 18 of combined mixer circuit 12. Combined mixer circuit 12 further includes a mixer circuit 24 having a first input connected to an output 20 of mixer circuit 14. The signal $I_{OUT20}$ is generated by mixer circuit 14 and supplied at output 20. A second input of mixer circuit 24 is connected to terminal 28 of combined mixer circuit 12. The output of mixer circuit 24 is connected to terminal 30 of combined mixer circuit 12.

Combined mixer circuit 32 has input terminals 36, 38, and 48, and an output terminal 50. More particularly, combined mixer circuit 32 includes a mixer circuit 34 having a first input connected to terminal 36 for receiving the signal $RF_{IN}$. A second input of mixer circuit 34 is connected to terminal 38 of combined mixer circuit 32. Combined mixer circuit 32 further includes a mixer circuit 44 having a first input connected to a terminal 40 of mixer circuit 34. The signal $I_{OUT40}$ is generated by mixer circuit 34 and supplied at terminal 40. A second input of mixer circuit 44 is connected to terminal 48 of combined mixer circuit 32. The output of mixer circuit 44 is connected to terminal 50 of combined mixer circuit 32.

In addition, image rejection circuit 10 includes a Local Oscillator (LO) 26 having an output that is commonly connected to an input of phase shift circuit (Ø) 22, to an input of phase shift circuit (Ø) 42, and to a first input of a counter 25. LO 26 generates the oscillator signal $V_{OSC}$. An output of phase shift circuit 22 is connected to terminal 18 of combined mixer circuit 12. An output of phase shift circuit 42 is connected to terminal 38 of combined mixer circuit 32. Counter 25 has a second input coupled for receiving a select signal $N_{SEL}$, where $N_{SEL}$ is a value that determines the frequency of the divided signal generated by counter 25. An output of counter 25 is commonly connected to an input of a phase shift circuit 29 and to an input of a phase shift circuit 31. An output of phase shift circuit 29 is connected to terminal 28 of combined mixer circuit 12. An output of phase shift circuit 31 is connected to terminal 48 of combined mixer circuit 32. Further, terminals 30 and 50 of respective combined mixer circuits 12 and 32 are connected to inputs of a summing circuit 46. An output of summing circuit 46 provides the signal $IF_{OUT}$.

Although, mixer circuits 14, 24, 34 and 44, local oscillator 26, counter 25, and phase shift circuits 22, 29, 31, and 42 have been illustrated as having single-ended inputs and outputs for simplicity, the signals $RF_{IN}$, $V_{OSC}$, and $IF_{OUT}$, among others, may be differential signals. Thus, the use of single-ended signals in image rejection circuit 10 are not a limitation of the present invention. It should also be noted that LO 26 and the input of counter 25 could alternatively be connected to the inputs of phase shift circuits 29 and 31 and the output of counter 25 would then be connected to phase shift circuits 22 and 42.

Figure 2:
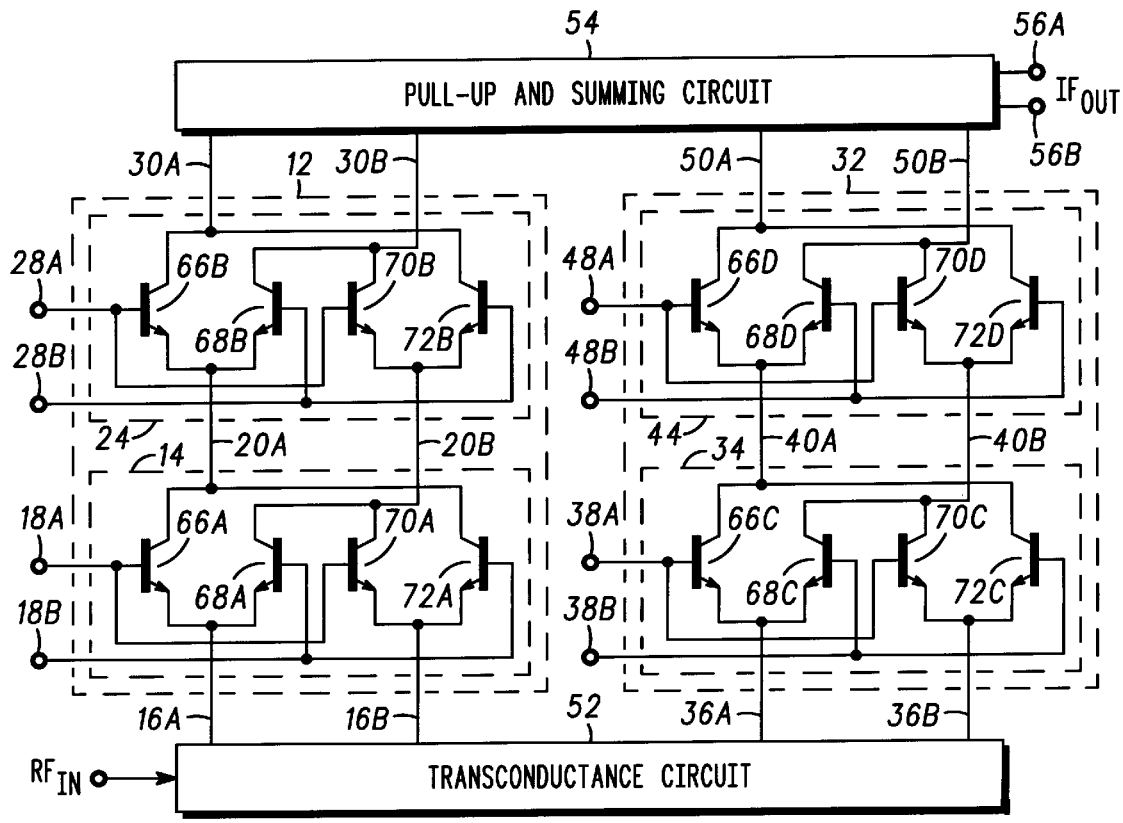
FIG. 2 is a schematic diagram of the combined mixer circuit of FIG. 1 in accordance with a first embodiment of the present invention.

FIG. 2 is a schematic diagram of combined mixer circuits 12 and 32 of FIG. 1 in accordance with a first embodiment of the present invention. It should be noted that the same reference numbers are used in the figures to denote the same elements. Included in FIG. 2 are mixer circuits 14, 24, 34, and 44. Mixer circuits 14 and 24 of combined mixer circuit 12 are in a first stacked configuration. Mixer circuits 14 and 24 each include two differential pairs of bipolar transistors. More particularly, mixer circuit 14 has current output terminals 20A and 20B for supplying a current and current input terminals 16A and 16B for receiving a current. The letters A and B have been appended to reference numbers 20 and 16 to indicate that these terminals operate with differential signals. Mixer circuit 14 includes transistors 66A and 68A that are connected as a first differential pair and transistors 70A and 72A that are connected as a second differential pair.

Transistors 66A and 68A have emitters that are commonly connected to each other and to terminal 16A. Transistors 70A and 72A have emitters that are commonly connected to each other and to terminal 16B. Transistors 66A and 70A have bases that are commonly connected to each other and to terminal 18A of combined mixer circuit 12. Transistors 68A and 72A have bases that are commonly connected to each other and to terminal 18B of combined mixer circuit 12. The letters A and B have been appended to reference number 18 to indicate that the signal received at terminal 18 (FIG. 1) is a differential signal applied to terminals 18A and 18B. Further, transistors 66A and 72A have collectors that are commonly connected to each other and to terminal 20A. Transistors 68A and 70A have collectors that are commonly connected to each other and to terminal 20B.

Mixer circuit 24 includes transistors 66B and 68B that are connected as a first differential pair, wherein an emitter of transistor 66B is commonly connected to an emitter of transistor 68B. The commonly connected emitters of transistors 66B and 68B are connected to terminal 20A. Transistors 70B and 72B are connected as a second differential pair, wherein an emitter of transistor 70B is commonly connected to an emitter of transistor 72B. The commonly connected emitters of transistors 70B and 72B are connected to terminal 20B.

In addition, transistors 66B and 70B have bases that are commonly connected to each other and to terminal 28A of mixer circuit 24. Transistors 68B and 72B have bases that are commonly connected to each other and to terminal 28B of mixer circuit 24. The letters A and B have been appended to reference number 28 to indicate that the signal received at terminal 28 (FIG. 1) is a differential signal applied to terminals 28A and 28B. Further, transistors 66B and 72B have collectors that are commonly connected to each other and to terminal 30A. Transistors 68B and 70B have collectors that are commonly connected to each other and to terminal 30B. The letters A and B have been appended to reference number 30 to indicate that terminals 30A and 30B receive differential signals.

Mixer circuits 34 and 44 of combined mixer circuit 32 are in a second stacked configuration. Mixer circuits 34 and 44 each include two differential pairs of NPN bipolar transistors. More particularly, mixer circuit 34 has current output terminals 40A and 40B for supplying a current and current input terminals 36A and 36B for receiving a current. Mixer circuit 34 includes transistors 66C and 68C that are connected as a first differential pair and transistors 70C and 72C that are connected as a second differential pair.

Transistors 66C and 68C have emitters that are commonly connected to each other and to terminal 36A. Transistors 70C and 72C have emitters that are commonly connected to each other and to terminal 36B. Transistors 66C and 70C have bases that are commonly connected to each other and to terminal 38A of mixer circuit 34. Transistors 68C and 72C have bases that are commonly connected to each other and to terminal 38B of mixer circuit 34. The letters A and B have been appended to reference number 38 to indicate that the signal received at terminal 38 (FIG. 1) is a differential signal applied to terminals 38A and 38B. Further, transistors 66C and 72C have collectors that are commonly connected to each other and to terminal 40A. Transistors 68C and 70C have collectors that are commonly connected to each other and to terminal 40B.

Mixer circuit 44 includes transistors 66D and 68D connected as a first differential pair, wherein an emitter of transistor 66D is commonly connected to an emitter of transistor 68D. The commonly connected emitters of transistors 66D and 68D are connected to terminal 40A. Transistors 70D and 72D are connected as a second differential pair, wherein an emitter of transistor 70D is connected to an emitter of transistor 72D. The commonly connected emitters of transistors 70D and 72D are connected to terminal 40B.

In addition, transistors 66D and 70D have bases that are commonly connected to each other and to terminal 48A of mixer circuit 44. Transistors 68D and 72D have bases that are commonly connected to each other and to terminal 48B of mixer circuit 44. The letters A and B have been appended to reference number 48 to indicate that the signal received at terminal 48 (FIG. 1) is a differential signal applied to terminals 48A and 48B. Further, transistors 66D and 72D have collectors that are commonly connected to each other and to a terminal 50A. Transistors 68D and 70D have collectors that are commonly connected to each other and to a terminal 50B.

It is not a limitation of the present invention that the transistors in combined mixer circuits 12 and 32 be bipolar transistors. Alternatively, transistors having a control terminal and two current carrying terminals such as, for example, Metal Oxide Semiconductor Field Effect Transistors (MOSFETs), Gallium Arsenide Field Effect Transistors (GaAs FETs), or the like, could be used.

Further, combined mixer circuits 12 and 32 include a transconductance circuit 52 that is coupled to mixer circuits 14 and 34. Transconductance circuit 52 has outputs for supplying current to terminals 16A and 16B of mixer circuit 14 and current to terminals 36A and 36B of mixer circuit 34. The signal $RF_{IN}$ is coupled via transconductance circuit 52 to terminal 16 of combined mixer circuit 12 and to terminal 36 of combined mixer circuit 32 for selecting terminals 16A, 16B, 36A, and 36B to receive a current. In addition, combined mixer circuits 12 and 32 include a pull-up and summing circuit 54 that is coupled to mixer circuits 24 and 44. Pull-up and summing circuit 54 has inputs connected to terminals 30A and 30B of mixer circuit 24 and terminals 50A and 50B of mixer circuit 44. Pull-up and summing circuit 54 has terminals 56A and 56B for supplying the differential signal $IF_{OUT}$. Thus, pull-up and summing circuit 54 of FIG. 2 includes summing circuit 46 of FIG. 1. Pull-up and summing circuit 54 could include resistors (not shown) coupled between terminals 30A, 30B, 50A, and 50B and a power supply conductor such as, for example, $V_{CC}$. Alternatively, a person skilled in the art could use current mirrors and a push-pull driver circuit (not shown) to provide the signal $IF_{OUT}$.

In operation, mixer circuits 14 and 34 multiply the received signal $RF_{IN}$ with the signal $V_{OSC}$ generated by LO 26 to produce signals $I_{OUT20}$ and $I_{OUT40}$ having carrier frequency components that are the sum of the carrier frequencies of the signals $RF_{IN}$ and $V_{OSC}$ and components that are the difference of the carrier frequencies of the signals $RF_{IN}$ and $V_{OSC}$. It should be noted that signals $I_{OUT20}$ and $I_{OUT40}$ may have different phase relationships with respect to each other. Phase shift circuits 22 and 42 generate signals that can vary in phase over a range of values and have a desired phase relationship with the signal $V_{OSC}$.

In addition, an undesired image at the input of image rejection circuit 10 has a frequency that is offset by the frequency of LO 26. In other words, image rejection circuit 10 receives both a signal $RF_{IN}$ and an undesired image signal having frequencies that are either higher or lower than the frequency of the signal $V_{OSC}$ generated by LO 26. Thus, the signals $I_{OUT20}$ and $I_{OUT40}$ are frequency translated from the signal $RF_{IN}$ and have components that are the desired signals and components that are the undesired image signals.

Mixer circuit 24 multiplies the signal $I_{OUT20}$ and the signal appearing at terminal 28 of combined mixer circuit 12. Mixer circuit 44 multiplies the signal $I_{OUT40}$ and the signal appearing at terminal 48 of combined mixer circuit 32. Mixer circuits 24 and 44 generate outputs at respective terminals 30 and 50 having components that are the sum of the signals at the inputs of the corresponding mixer circuit and components that are the difference of the signals at the corresponding inputs of the mixer circuit. Mixer circuits 24 and 44 translate the frequency of the signals $I_{OUT20}$ and $I_{OUT40}$ in accordance with the frequency of the signal at the output of counter 25 as determined by the select signal $N_{SEL}$. Also, the undesired image component of the signals $I_{OUT20}$ and $I_{OUT40}$ appearing at the inputs of mixer circuits 24 and 44 result in signals at terminals 30 and 50 that can have unwanted frequency components.

Counter 25 is a divide-by-N counter that reduces the frequency of the signal $V_{OSC}$ in accordance with the select signal $N_{SEL}$. Thus, counter 25 divides the frequency of the signal $V_{OSC}$ by an integer "N" to produce a counter output signal. When the integer "N" is 2, 4, 8, etc., counter 25 produces a counter output signal that is respectively one-half, one-fourth, one-eighth, etc., the frequency of the signal $V_{OSC}$. Although the relationship between the frequency of the signal $V_{OSC}$ and the frequency of the signal at the output terminal of counter 25 has been shown to be a binary relationship, it should be understood this is not a limitation of the present invention.

By way of example, image rejection circuit 10 generates an output signal $IF_{OUT}$ that is in-phase with the signal $RF_{IN}$ when phase shift circuits 31 and 42 each provide a phase shift of ninety degrees and phase shift circuits 22 and 29 each provide a phase shift of zero degrees. In other words, the signal $RF_{IN}$ applied at the input of image rejection circuit 10 and expressed as a cosine term causes an output signal $IF_{OUT}$ that is also expressed as a cosine term. The unwanted image signal is rejected when phase shift circuits 31 and 42 each provide a phase shift of ninety degrees and phase shift circuits 22 and 29 each provide a phase shift of zero degrees. On the other hand, image rejection circuit 10 generates an output signal $IF_{OUT}$ that is in quadrature with the signal $RF_{IN}$ when phase shift circuits 29 and 42 each provide a phase shift of ninety degrees and phase shift circuits 22 and 31 each provide a phase shift of zero degrees. In other words, the signal $RF_{IN}$ expressed as a cosine term causes an output signal $IF_{OUT}$ that is expressed as a sine term. The unwanted image signal is rejected when phase shift circuits 29 and 42 each provide a phase shift of ninety degrees and phase shift circuits 22 and 31 each provide a phase shift of zero degrees.

Summing circuit 46 provides either the sum or the difference of the signals present at terminals 30 and 50 of the respective combined mixer circuits 12 and 32. When the desired frequency components of the signals at terminals 30 and 50 are in-phase and the undesired image components of the signals are out-of-phase, the addition of the signals at terminals 30 and 50 causes rejection of the unwanted image components. Ideally, in accordance with the input signal $RF_{IN}$ expressed as a cosine or a sine signal, the sum of the signals or the difference of the signals at terminals 30 and 50 is selected and the undesired frequency components are canceled; therefore, only the desired signals remain. In other words, cancellation of the undesired frequency components in the signal $IF_{OUT}$ at the output of summing circuit 46 causes image rejection. It should be noted that combined mixer circuits 12 and 32 use a common transconductance circuit 52 (FIG. 2) and have a higher linearity when compared with mixer circuits that each have their own transconductance circuit.

Figure 3:
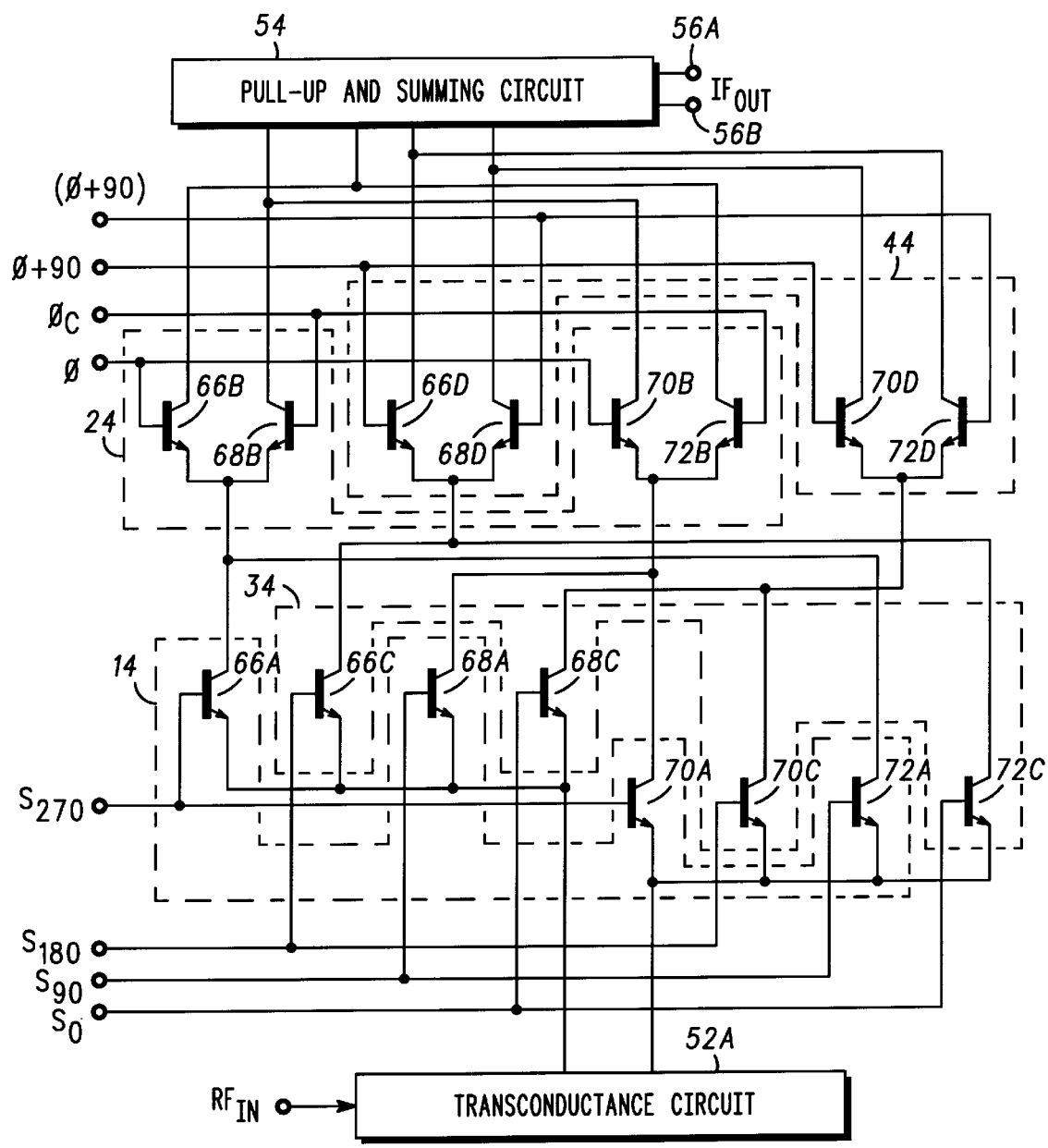
FIG. 3 is a schematic diagram of the combined mixer circuit of FIG. 1 in accordance with a second embodiment of the present invention.

FIG. 3 is a schematic diagram of combined mixer circuits 12 and 32 of FIG. 1 in accordance with a second embodiment of the present invention. Combined mixer circuits 12 and 32 receive signals $RF_{IN}$, $S_0$, $S_{90}$, $S_{180}$, $S_{270}$, $Ø$, $Ø_C$, $(Ø+90)$, and $(Ø+90)_C$, and generate signal $IF_{OUT}$. It should be noted that signals $S_0$ and $S_{180}$ are one hundred and eighty degrees out-of-phase with respect to each other. Similarly, signals $S_{90}$ and $S_{270}$ are one hundred and eighty degrees out-of-phase with respect to each other. Further, signals $S_0$ and $S_{90}$ have a quadrature relationship, i.e., signals $S_0$ and $S_{90}$ are ninety degrees out-of-phase with respect to each other. Although signals $S_0$, $S_{90}$, $S_{180}$, $S_{270}$ have been described having specific phase relationships, other phase relationships are acceptable for image rejection circuit 10.

More particularly, differential quadrature signals $S_{270}$ and $S_{90}$ are generated by phase shift circuit 22 for mixer circuit 14 (FIG. 1). Mixer circuit 14 includes transistors 66A, 68A, 70A, and 72A. Differential quadrature signals $S_{180}$ and $S_0$ are generated by phase shift circuit 42 for mixer circuit 34 (FIG. 1). Mixer circuit 34 includes transistors 66C, 68C, 70C, and 72C. In this embodiment, the commonly connected emitters of transistors 66A and 68A are also connected to the commonly connected emitters of transistors 66C and 68C and to a first input of transconductance circuit 52A. Further, the commonly connected emitters of transistors 70A and 72A are also connected to the commonly connected emitters of transistors 70C and 72C and to a second input of transconductance circuit 52A. It should be noted that transconductance circuit 52A has a differential output and reduces current consumption by providing fewer current paths in comparison to transconductance circuit 52 of FIG. 2. Transistors 66A and 70A have bases that are commonly connected to each other and receive the signal $S_{270}$. Transistors 68A and 72A have bases that are commonly connected to each other and receive the signal $S_{90}$. Transistors 66C and 70C have bases that are commonly connected to each other and receive the signal $S_{180}$. Transistors 68C and 72C have bases that are commonly connected to each other and receive the signal $S_0$.

The signal $Ø_C$ is the complement of the signal $Ø$, i.e., the signals $Ø$ and $Ø_C$ are one hundred and eighty degrees out-of-phase. The signal $(Ø+90)$ is shifted ninety degrees with respect to the signal $Ø$. The signal $(Ø+90)_C$ is the complement of the signal $(Ø+90)$, i.e., the signals $(Ø+90)$ and $(Ø+90)_C$ are one hundred and eighty degrees out-of-phase. More particularly, the signals $(Ø+90)$ and $(Ø+90)_C$ are generated by phase shift circuit 31 for mixer circuit 44 (FIG. 1). Mixer circuit 44 includes transistors 66D, 68D, 70D, and 72D. Signals $Ø$ and $Ø_C$ are generated by phase shift circuit 29 for mixer circuit 24 (FIG. 1). Mixer circuit 24 includes transistors 66B, 68B, 70B, and 72B. Although signals Ø, Ø$_C$, (Ø+90), and (Ø+90)$_C$ have been described having specific phase relationships, other phase relationships are acceptable for image rejection circuit 10.

Transistors 66B and 70B have bases that are commonly connected to each other and receive the signal Ø. Transistors 68B and 72B have bases that are commonly connected to each other and receive the signal Ø$_C$. Transistors 66D and 70D have bases that are commonly connected to each other and receive the signal (Ø+90). Transistors 68D and 72D have bases that are commonly connected to each other and receive the signal (Ø+90)$_C$.

Transistors 66A and 72A have collectors that are commonly connected to each other and to the commonly connected emitters of transistors 66B and 68B. Transistors 68A and 70A have collectors that are commonly connected to each other and to the commonly connected emitters of transistors 70B and 72B. Transistors 66C and 72C have collectors that are commonly connected to each other and to the commonly connected emitters of transistors 66D and 68D. Transistors 68C and 70C have collectors that are commonly connected to each other and to the commonly connected emitters of transistors 70D and 72D.

Further, transistors 66B and 72B have collectors that are commonly connected to each other and to a first input of pull-up and summing circuit 54. Transistors 68B and 70B have collectors that are commonly connected to each other and to a second input of pull-up and summing circuit 54. Transistors 66D and 72D have collectors that are commonly connected to each other and to a third input of pull-up and summing circuit 54. Transistors 68D and 70D have collectors that are commonly connected to each other and to a fourth input of pull-up and summing circuit 54. Pull-up and summing circuit 54 has output terminals 56A and 56B for supplying the differential signal IF$_{OUT}$.

Figure 4:
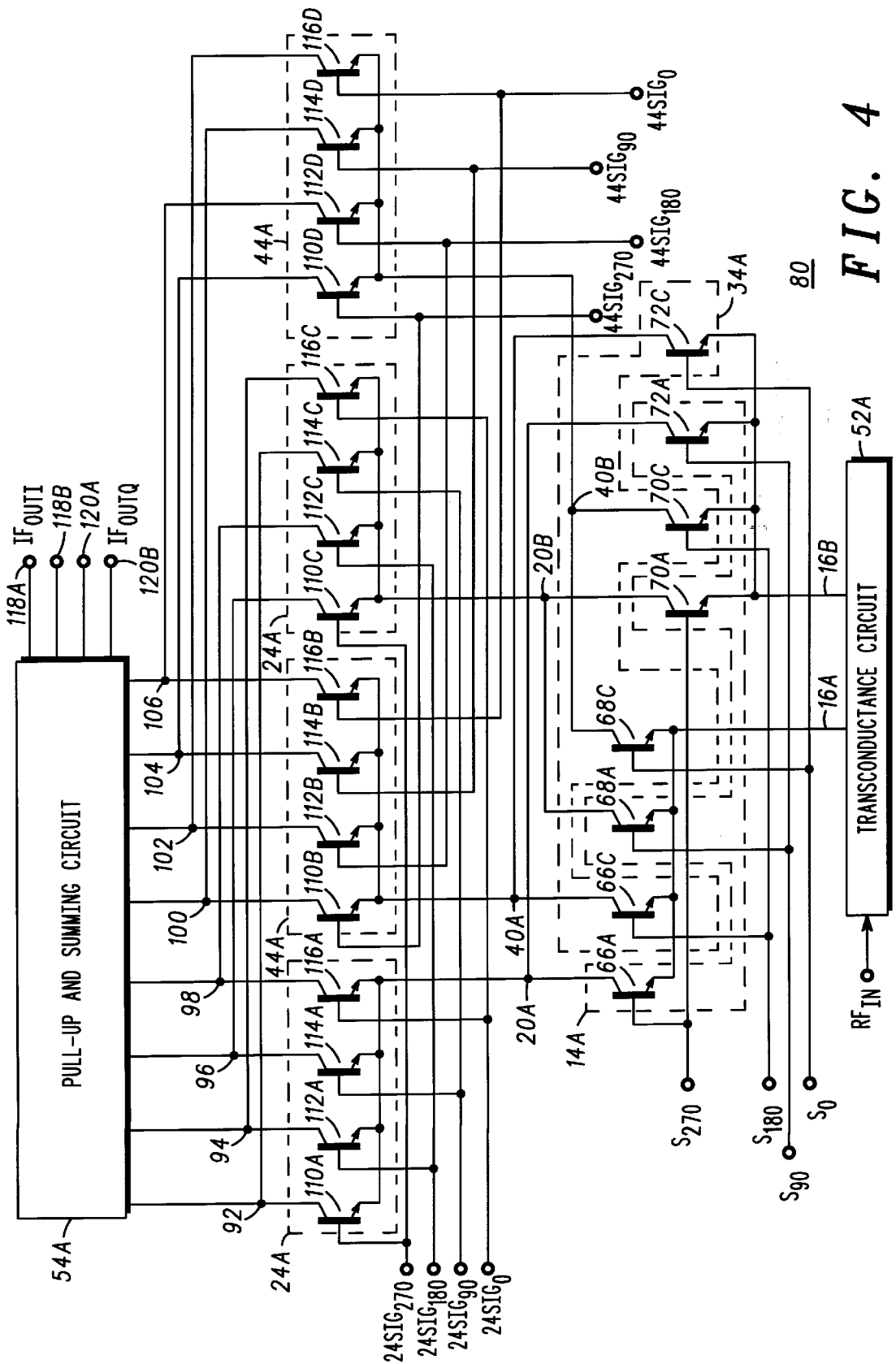
FIG. 4 is a schematic diagram of a quadrature combined mixer in accordance with the present invention.

FIG. 4 is a schematic diagram of a quadrature combined mixer circuit 80 in accordance with an embodiment of the present invention. Quadrature combined mixer circuit 80 includes mixer circuits 14A, 24A, 34A, and 44A. The letter A has been appended to reference numbers 14, 24, 34, and 44 to indicate that differential quadrature signals are received at the inputs. More particularly, mixer circuit 14A has output terminals 20A and 20B for supplying a current and input terminals 16A and 16B for receiving a current. Mixer circuit 34A has output terminals 40A and 40B for supplying a current and input terminals 16A and 16B for receiving a current. The letters A and B have been appended to reference number 16 to indicate that terminals 16A and 16B receive differential signals. Transistors 66A and 68A of mixer circuit 14A and transistors 66C and 68C of mixer circuit 34A have emitters that are commonly connected to each other and to terminal 16A. Transistors 70A and 72A of mixer circuit 14A and transistors 70C and 72C of mixer circuit 34A have emitters that are commonly connected to each other and to terminal 16B.

Transistors 66A and 70A have bases that are connected to each other and receive the signal S$_{270}$ and transistors 68A and 72A have bases that are connected to each other and receive the signal S$_{90}$, wherein the signals S$_{270}$ and S$_{90}$ are generated by phase shift circuit 22. On the other hand, transistors 66C and 70C have bases that are connected to each other and receive the signal S$_{180}$ and transistors 68C and 72C have bases that are connected to each other and receive the signal S$_0$, wherein the signals S$_0$ and S$_{180}$ are generated by phase shift circuit 42.

Transistors 66A and 72A have collectors that are commonly connected to each other and to terminal 20A. Transistors 66C and 72C have collectors that are commonly connected to each other and to terminal 40A. Transistors 68A and 70A have collectors that are commonly connected to each other and to terminal 20B. Transistors 68C and 70C have collectors that are commonly connected to each other and to terminal 40B.

Mixer circuit 24A has output terminals 92, 94, 96, and 98 for supplying a current. Mixer circuit 24A includes transistors 110A, 112A, 114A, and 116A having emitters that are commonly connected to each other and to terminal 20A, and transistors 110C, 112C, 114C, and 116C having emitters that are commonly connected to each other and to terminal 20B. Mixer circuit 44A has output terminals 100, 102, 104, and 106 for supplying a current. Mixer circuit 44A includes transistors 110B, 112B, 114B, and 116B having emitters that are commonly connected to each other and to terminal 40A, and transistors 110D, 112D, 114D, and 116D having emitters that are commonly connected to each other and to terminal 40B.

Differential quadrature signals 24SIG$_0$, 24SIG$_{90}$, 24SIG$_{180}$, and 24SIG$_{270}$ are generated by phase shift circuit 29 for mixer circuit 24A. It should be noted that signals 24SIG$_0$ and 24SIG$_{180}$ are one hundred and eighty degrees out-of-phase with respect to each other. Signals 24SIG$_{90}$ and 24SIG$_{270}$ are one hundred and eighty degrees out-of-phase with respect to each other. Further, signals 24SIG$_0$ and 24SIG$_{90}$ have a quadrature relationship and are ninety degrees out-of-phase with respect to each other.

Transistors 110A and 110C have bases that are commonly connected to each other and receive the signal 24SIG$_{270}$; transistors 112A and 112C have bases that are commonly connected to each other and receive the signal 24SIG$_{180}$; transistors 114A and 114C have bases that are commonly connected to each other and receive the signal 24SIG$_{90}$; and transistors 116A and 116C have bases that are commonly connected to each other and receive the signal 24SIG$_0$; wherein the signals 24SIG$_{270}$, 24SIG$_{180}$, 24SIG$_{90}$ and 24SIG$_0$ are generated by phase shift circuit 29.

Differential quadrature signals 44SIG$_0$, 44SIG$_{90}$, 44SIG$_{180}$, and 44SIG$_{270}$ are generated by phase shift circuit 31 for mixer circuit 44A. Signals 44SIG$_0$ and 44SIG$_{180}$ are one hundred and eighty degrees out-of-phase with respect to each other. Signals 44SIG$_{90}$ and 44SIG$_{270}$ are one hundred and eighty degrees out-of-phase with respect to each other. Signals 44SIG$_0$ and 44SIG$_{90}$ have a quadrature relationship and are ninety degrees out-of-phase with respect to each other.

Transistors 110B and 110D have bases that are commonly connected to each other and receive the signal 44SIG$_{270}$; transistors 112B and 112D have bases that are commonly connected to each other and receive the signal 44SIG$_{180}$; transistors 114B and 114D have bases that are commonly connected to each other and receive the signal 44SIG$_{90}$; and transistors 116B and 116D have bases that are commonly connected to each other and receive the signal 44SIG$_0$; wherein the signals 44SIG$_{270}$, 44SIG$_{180}$, 44SIG$_{90}$ and 44SIG$_o$ are generated by phase shift circuit 31.

Further, transistors 110A and 114C have collectors that are commonly connected to each other and to terminal 92. Transistors 112A and 116C have collectors that are commonly connected to each other and to terminal 94. Transistors 114A and 110C have collectors that are commonly connected to each other and to terminal 96. Transistors 116A and 112C have collectors that are commonly connected to each other and to terminal 98. Transistors 110B and 114D have collectors that are commonly connected to each other and to terminal 100. Transistors 112B and 116D have collectors that are commonly connected to each other and to terminal 102. Transistors 114B and 110D have collectors that are commonly connected to each other and to terminal 104. Transistors 116B and 112D have collectors that are commonly connected to each other and to terminal 106.

Pull-up and summing circuit 54A has inputs connected to terminals 92, 94, 96, 98, 100, 102, 104, and 106 of mixer circuits 24A and 44A. Pull-up and summing circuit 54A has output terminals 118A and 118B for providing the differential signal $IF_{OUTI}$ and output terminals 120A and 120B for providing the differential signal $IF_{OUTQ}$. The signal $IF_{OUTI}$ is in-phase with the signal $RF_{IN}$ and the signal $IF_{OUTQ}$ has a quadrature relationship with the signal $RF_{IN}$.

By now it should be appreciated that a structure and a method have been provided for translating a signal in the RF frequency range to a lower frequency while rejecting the unwanted image signal. The use of phase shift circuits that provide a ninety degree phase shift at inputs of combined mixer circuits cause the cancellation of the unwanted image signal.

What is claimed is:

1. An image rejection circuit, comprising:
   a first mixer circuit having a first input, a second input, and an output, wherein the first input is coupled for receiving a first signal and the second input is coupled for receiving a second signal;
   a second mixer circuit having a first input, a second input, and an output, wherein the first input is coupled to the output of the first mixer circuit and the second input is coupled for receiving a third signal;
   a third mixer circuit having a first input, a second input, and an output, wherein the first input is coupled for receiving the first signal and the second input is coupled for receiving a fourth signal; and
   a fourth mixer circuit having a first input, a second input, and an output, wherein the first input is coupled to the output of the third mixer circuit and the second input is coupled for receiving a fifth signal, wherein the first mixer circuit includes:
      a first differential transistor pair having first and second transistors, wherein the first and second transistors each have a control terminal and first and second current carrying terminals; and
      a second differential transistor pair having third and fourth transistors, wherein the third and fourth transistors each have a control terminal and first and second current carrying terminals, and wherein the first current carrying terminal of the first and fourth transistors are coupled to form a first current output terminal, the first current carrying terminals of the second and third transistors are coupled to form a second current output terminal, the second current carrying terminals of the first and second transistors are coupled to form a first current input terminal, the second current carrying terminals of the third and fourth transistors are coupled to form a second current input terminal, and the control terminals of the first and third transistors are commonly coupled and the control terminals of the second and fourth transistors are commonly coupled for receiving the second signal.

2. The image rejection circuit of claim 1, further comprising a summing circuit having a first input coupled to the output of the second mixer circuit, a second input coupled to the output of the fourth mixer circuit, and an output that provides an output signal that is translated in frequency from the first signal.

3. The image rejection circuit of claim 1, further comprising a counter having a first input coupled for receiving a sixth signal, a second input coupled for receiving a select signal, and an output coupled to the second input of the second mixer circuit and to the second input of the fourth mixer circuit.

4. The image rejection circuit of claim 3, further comprising a first phase shift circuit having an input coupled to the first input of the counter and an output coupled to the second input of the third mixer circuit.

5. The image rejection circuit of claim 4, further comprising a second phase shift circuit having an input coupled to the output of the counter and an output coupled to the second input of the fourth mixer circuit.

6. The image rejection circuit of claim 4, further comprising a second phase shift circuit having an input coupled to the output of the counter and an output coupled to the second input of the second mixer circuit.

7. The image rejection circuit of claim 1, wherein the second mixer circuit further includes:
   a first differential transistor pair having first and second transistors, wherein the first and second transistors each have a control terminal and first and second current carrying terminals; and
   a second differential transistor pair having third and fourth transistors, wherein the third and fourth transistors each have a control terminal and first and second current carrying terminals, and wherein the first current carrying terminals of the first and fourth transistors are coupled to form a third current output terminal, the first current carrying terminals of the second and third transistors are coupled to form a fourth current output terminal, the second current carrying terminals of the first and second transistors are coupled to form the first current output terminal, the second current carrying terminals of the third and fourth transistors are coupled to form the second current output terminal, and the control terminals of the first and third transistors are commonly coupled and the control terminals of the second and fourth transistors are commonly coupled for receiving the third signal.

* * * * *